(12) United States Patent
Inoue et al.

(10) Patent No.: US 6,509,971 B2
(45) Date of Patent: Jan. 21, 2003

(54) INTERFEROMETER SYSTEM

(75) Inventors: Fuyuhiko Inoue, Sagamihara (JP); David Stumbo, Belmont, CA (US)

(73) Assignee: Nikon Corporation, Tokyo (JP)

( * ) Notice: Subject to any disclaimer, the term of this patent is extended or adjusted under 35 U.S.C. 154(b) by 44 days.

(21) Appl. No.: 09/851,377

(22) Filed: May 9, 2001

(65) Prior Publication Data

US 2002/0167675 A1 Nov. 14, 2002

(51) Int. Cl.[7] .............................................. G01B 11/02
(52) U.S. Cl. ...................... 356/487; 356/493; 356/510
(58) Field of Search ................................. 356/487, 490, 356/492, 493, 498, 508, 509, 510, 500, 399, 400, 401; 355/53; 250/559.3, 559.37

(56) References Cited

U.S. PATENT DOCUMENTS

| | | | |
|---|---|---|---|
| 4,215,938 A | 8/1980 | Farrand et al. | |
| 5,076,695 A | 12/1991 | Ichihara | |
| 5,114,234 A | 5/1992 | Otsuka et al. | |
| 5,187,543 A | 2/1993 | Ebert | |
| 5,274,436 A | * 12/1993 | Chaney | 356/487 |
| 5,379,115 A | 1/1995 | Tsai | |
| 5,392,120 A | 2/1995 | Kamiya | |
| 5,523,839 A | 6/1996 | Robinson et al. | |
| 5,537,209 A | 7/1996 | Lis | |
| 5,585,922 A | 12/1996 | Sueyoshi | |
| 5,724,136 A | 3/1998 | Zanoni | |
| 5,737,069 A | * 4/1998 | Nashiki et al. | 356/4.09 |
| 5,764,361 A | 6/1998 | Kato et al. | |
| 5,790,253 A | 8/1998 | Kamiya | |
| 5,991,033 A | * 11/1999 | Henshaw et al. | 356/487 |
| 6,320,665 B1 | * 11/2001 | Ngoi et al. | 356/485 |

* cited by examiner

*Primary Examiner*—David P. Porta
(74) *Attorney, Agent, or Firm*—Finnegan, Henderson, Farabow, Garrett, & Dunner, L.L.P.

(57) ABSTRACT

An interferometric measuring system including a movable member having a measurement reflector attached thereto, a stationary member having a reference reflector attached thereto, a light source for providing a light beam, and an optical support block having first and second beam splitters mounted thereon. The first beam splitter is operable to convert the light beam into a first pair of orthogonally polarized beams and arranged to direct one of the first pair of beams along a reference path to the reference reflector and the other of the first pair of beams along a measurement path to the measurement reflector to create a measurement interference pattern between the first pair of beams for determining a position of the movable member. The second beam splitter is operable to form a second pair of orthogonally polarized beams and arranged to direct the second pair of beams along support block measurement paths to the reference reflector. The second beam splitter is configured to form a correction interference pattern between the second pair of beams for determining error in the position of the movable member due to movement of the optical support block.

21 Claims, 13 Drawing Sheets

INTERFEROMETER SYSTEM

FIELD OF THE INVENTION

The invention relates generally to an interferometer system for position measurement, and more specifically, an interferometer system and method for improving the accuracy of interferometric measurements.

BACKGROUND OF THE INVENTION

Figure 1:
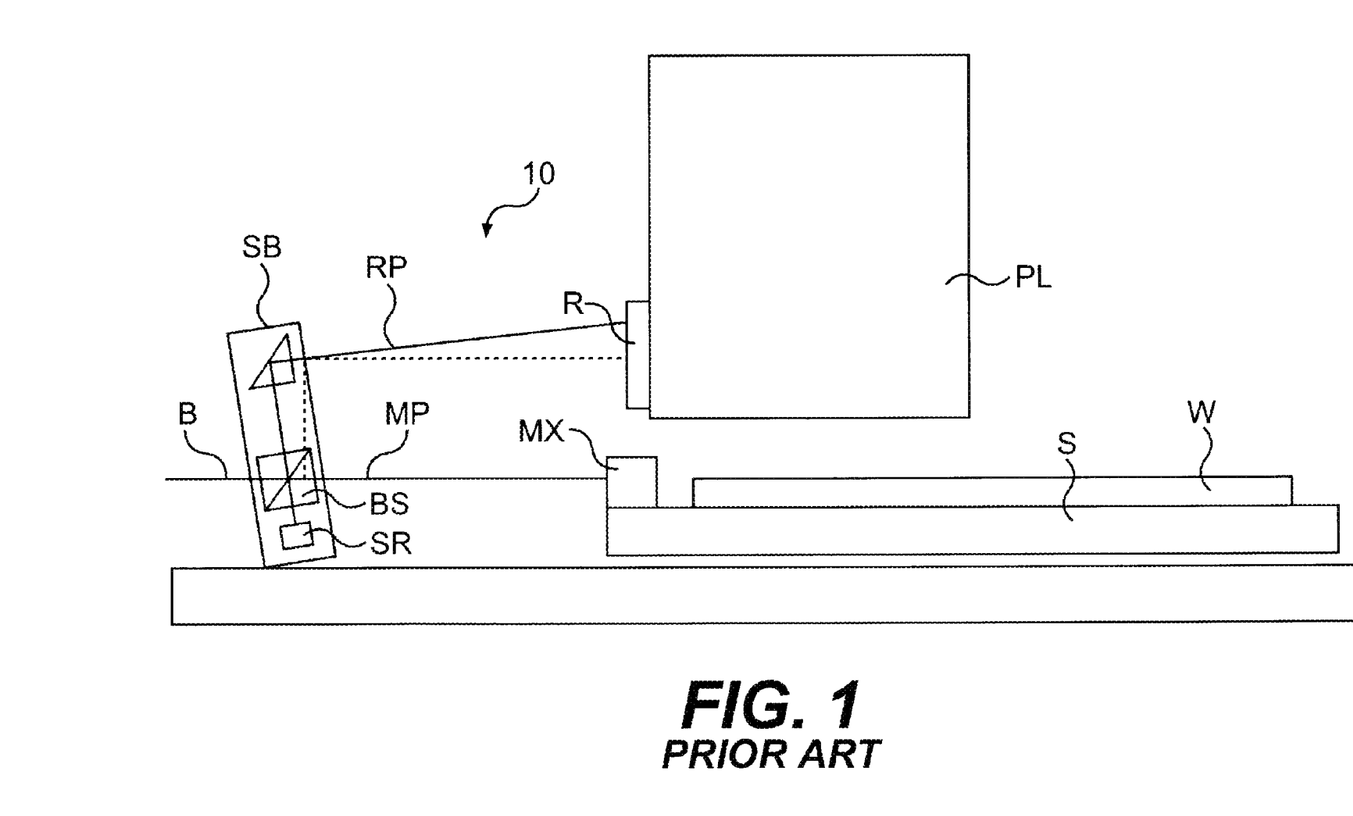
FIG. 1 is a side view of the prior art interferometer system showing rotation of optical components of the system.

A laser interferometer is often used to accurately measure relative displacement between two members in a projection exposure system used to manufacture semiconductor devices. The laser interferometer is used as a measuring apparatus for measuring the coordinates of a wafer stage or mask stage for highly accurate positioning of a semiconductor wafer or reticle relative to stationary projection optics. A prior art laser interferometer system is shown in FIG. 1. The interferometer system typically measures a change in position of a measurement mirror Mx, My (not shown in FIG. 1) attached to a movable stage S relative to a stationary reference mirror R attached to a projection lens PL. A laser source generates a beam B of light, part of which is reflected from the reference mirror R and part of which is reflected from the measurement mirror Mx (FIG. 1). The light reflected from the two mirrors Mx, R is then combined and reflected into a sensor SR. If the measurement mirror Mx moves relative to the reference mirror R, the intensity of the combined beam periodically increases and decreases as the reflected light from the two paths alternately interferes constructively and destructively. This constructive and destructive interference is caused by the two beams moving in and out of phase. Each half wavelength of movement of the measurement mirror results in a total optical path change of one wavelength and thus, one complete cycle of intensity change. The number of cycle changes indicates the number of wavelengths that the measurement mirror has moved. Therefore, by counting the number of times the intensity of the light cycles between darkest and lightest, the change in position of the measurement mirror can be estimated as an integral number of wavelengths.

As manufacturers of integrated circuits attempt to increase circuit density and reduce circuit feature size, interferometers are required to provide more precise measurement data. The precision with which interferometers provide position control has been improved by technical advances in the design of various optical components including lasers and photosensors. However, the performance of interferometers is still limited by changes in optical path length due to environmental disturbances that cause movement of the optical components of the interferometer system. When optical components, such as a beam splitter BS tilts or rotates due to thermal fluctuations, for example, the distance between the reference mirror R and the beam splitter changes (FIG. 1). This movement of the beam splitter BS causes an error in the position measurement of the stage S that results in misalignment of circuit patterns on the wafer W relative to one another.

There is, therefore, a need for an interferometer system that measures and corrects for movement of the optical components of the interferometer system.

SUMMARY OF THE INVENTION

The invention overcomes deficiencies of the prior art by providing an interferometric measuring system that measures and corrects for movement of optical components within the measuring system to provide a more accurate position measurement of a moving member such as a stage.

The interferometric measuring system generally includes a movable member having a measurement reflector attached thereto, a stationary member having a reference reflector attached thereto, a light source for providing a light beam, and an optical support block having first and second beam splitters mounted thereon. The first beam splitter is operable to convert the light beam into a first pair of polarized beams and arranged to direct one of the first pair of beams along a reference path to the reference reflector and the other of the first pair of beams along a measurement path to the measurement reflector to create a measurement interference pattern between the first pair of beams for determining a position of the movable member. The second beam splitter is operable to form a second pair of polarized beams and arranged to direct the second pair of beams along support block measurement paths to the reference reflector. The second beam splitter is configured to form a correction interference pattern between the second pair of beams for determining error in the position of the movable member due to movement of the optical support block.

In one embodiment, the beam splitter is optically aligned with the measurement reflector and interposed between the light source and the measurement reflector. Additional beam splitters and right angle reflectors may be included in the system to direct the beams along their respective paths.

A method of the invention is for measuring a position of a movable member relative to a stationary member with an interferometric measuring system and correcting for movement of optical components within the system relative to the stationary member. The movable member has a measurement reflector attached thereto and the stationary member has a reference reflector attached thereto. The method generally includes sensing a measurement interference pattern between a measurement light beam propagated through a measurement optical path including the measurement reflector, and a reference light beam propagated through a reference optical path including the reference reflector to determine a position of the movable member relative to the stationary member; and sensing a correction interference pattern between two correction light beams propagated through optical component measurement paths to determine movement of the optical components relative to the stationary member. The position of the movable member is then corrected to compensate for movement of the optical components.

The above is a brief description of some deficiencies in the prior art and advantages of the invention. Other features, advantages, and embodiments of the invention will be apparent to those skilled in the art from the following description, drawings, and claims.

BRIEF DESCRIPTION OF THE DRAWINGS

Corresponding reference characters indicate corresponding parts throughout the several views of the drawings.

DESCRIPTION OF THE INVENTION

An interferometer, such as one used in the prior art system 10 shown in FIG. 1 is used to accurately measure the displacement of a measurement target (e.g., stage S) by using interference between light waves that have propagated along a measurement optical path MP and a reference optical path RP. The interferometer may be used as a position measurement system of a stage apparatus such as a wafer stage or a mask stage in a one-shot or scan type exposure apparatus for which highly precise driving control is required. The interferometer is not limited to use with an exposure apparatus. The interferometer may be used to accurately measure the relative displacement between two members in various high precision tools, for example.

A measurement mirror (reflector) Mx is attached to the stage S and movable therewith to provide measurement of the measurement optical path MP, and a reference mirror (reflector) R is attached to a lens PL or other stationary portion of the exposure apparatus to provide the reference optical path RP (FIG. 1). The measurement mirror Mx is attached to the stage S parallel to the y direction and measurement mirror My is attached to the stage parallel to the x direction. The measurement mirror Mx is used to measure displacement of the stage along the x axis while the measurement mirror My is used to measure displacement of the stage along the y axis.

As shown in FIG. 1, a beam splitter BS of the interferometer system is mounted on a support block SB along with other optical components. The support block SB may tilt or rotate due to thermal fluctuations, vibration, or other environmental effects. This results in movement of the beam splitter BS and error in the measurement of the stage position due to rotation of the reflecting surface of the beam splitter BS. The movement of the support block SB and optical components may result in an error of the stage position. These inaccuracies in the stage position cause misalignment of the circuits on the semiconductor wafer W. As described below, the interferometer systems of the invention measure displacement of the support block SB and correct for this error in the stage position, thus providing improved accuracy in positioning of circuit patterns on the wafer W.

Figure 2:
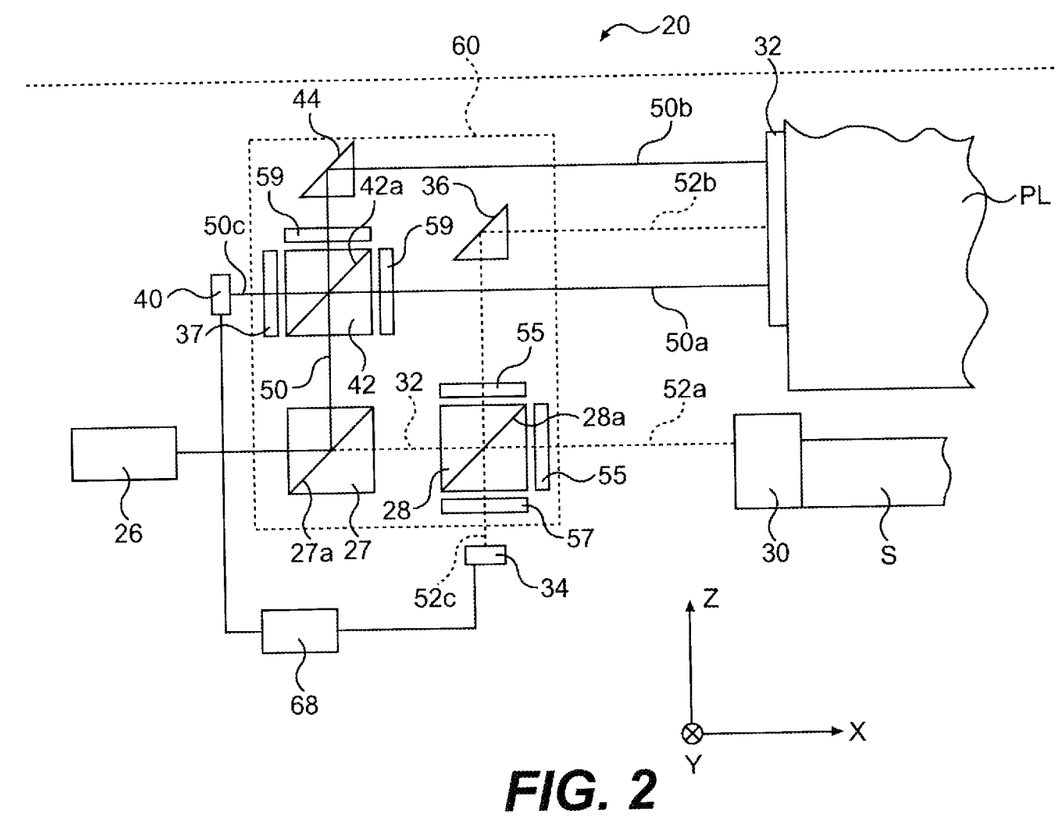
FIG. 2 is a side view of an interferometer system of the invention.

Referring now to FIG. 2, the interferometer system of the invention, generally indicated at 20, includes a measurement interferometer for measuring the position of the stage S relative to the projection lens PL and a correction interferometer for measuring rotation of an optical support block 60 relative to the x axis. The measurement interferometer includes a light source 26, a beam splitter 27, a beam splitter 28, a measurement mirror 30 attached to the stage S. a reference mirror 32 attached to the projection lens PL, a first sensor 34, and a right angle reflector 36. The correction interferometer is a differential interferometer including a second sensor 40, a beam splitter 42, a right angle reflector 44, and using the light source 26, beam splitter 27, beam splitter 28 and reference mirror 32 of the measurement interferometer.

FIG. 2 shows the arrangement of the light source (preferably a laser) 26, beam splitters 27, 28, 42, right angle reflectors 36, 44, mirrors 30, 32, and sensors 34, 40 of the interferometer system 20. The beam splitter 28 is positioned to receive a measurement interferometer beam 52 that is split by beam splitter 27. The beam splitter 42 is positioned to receive a correction interference beam 50 that is split by beam splitter 27. The right angle reflectors 36, 44 are each positioned over the beam splitters 28, 42, respectively.

The beam splitters 27, 28, 42, and other optical components of the interferometer system, are mounted on the optical support block 60, as shown in FIG. 2. The support block 60 is preferably connected to the ground or rigid structure of the exposure apparatus. Even though the support block 60 is rigidly attached to stationary structure, the block may move due to body deformation, thermal fluctuations, or other environmental effects. As further described below, the correction interferometer measures displacement of the support block 60 and corrects for any error in the stage position due to displacement of the support block.

The beam splitter 27 is a normal beam splitter that splits incident light received from the laser 26 into exiting beams 52 and 50 at surface 27a. Also, alternatively, beam splitter 27 can be eliminated and a second light source can be provided such that the light source 26 provides, for example, beam 50 and the second light source provides, for example, beam 52, or vice versa. A similar alternate modification can be made as appropriate in the embodiments described below.

The beam splitter 28 is formed from a polarizing cube having a polarizing surface 28a situated diagonally within the cube, as is well known by those skilled in the art. The polarizing surface 28a splits incident light of the measurement interferometer beam 52 into a measurement light component 52a and a reference light component 52b (first pair of beams), and reflects incident light of the correction interferometer beam 50 (50a and 50b).

The beam splitter 28 is optically aligned with the measurement mirror 30 and interposed between the laser source 26 and the measurement mirror. The beam splitter 28 directs the measurement beam 52a along a measurement path to the measurement mirror 30 and the reference beam 52b along a reference path to the reference mirror 32 to create a measurement interference pattern between the beams 52a and 52b. A portion (52a) of the measurement interferometer beam 52 is linearly polarized as it leaves the laser 26 such that it will pass through the polarizing surface 28a of the beam splitter 28 without being reflected therefrom. The beam 52a is then reflected from the measurement mirror 30 back to the beam splitter 28. The other portion (52b) of the measurement interferometer beam 52 is linearly polarized in a plane orthogonal to that of the first portion 52a such that the beam 52b will be reflected from the polarizing surface 28a rather than passing therethrough. The beam 52b is then reflected at a right angle within the right angle reflector 36 and directed to the reference mirror 32 where it is reflected back along the reference path to the beam splitter 28. The beam splitter 28 combines the measurement and reference beams 52a, 52b to form a beam 52c that propagates to the first sensor 34.

The beam splitter 42 is arranged to direct the second pair of beams 50a, 50b along support block measurement paths to the reference mirror 32 and form a correction interference pattern between the second pair of beams for determining error in the position of the stage S due to movement of the support block 60. A portion (50b) of the correction beam 50 is linearly polarized as it leaves the laser source 26 such that it will pass through the polarizing surface 42a of the beam splitter 42 without being reflected therefrom. The beam 50b is reflected at the right angle reflector 44 towards the reference mirror 32. The beam 50b is reflected at the reference mirror 32 back into the beam splitter 42. The other portion (50a) of the correction interferometer beam 50 is linearly polarized in a plane orthogonal to that of the first portion 50a of the beam such that it is reflected from the polarizing surface 42a of the beam splitter 42 rather than passing therethrough into the reference mirror 32. The beam 50a is reflected from the reference mirror 32 back along the same path until it reaches the second beam splitter 42 where it combines with the beam 50a to form a beam 50c that is received by the second sensor 40.

The first sensor 34 receives and compares the first pair of laser beams 52a, 52b to determine the position of the stage S. The second sensor 40 compares the second pair 50a, 50b to measure rotation of the support block 60 and beam splitters 27, 28, 42. The sensors 34, 40 include a receiving portion and an electric signal analysis portion, as is well known by those skilled in the art. The sensors 34, 40 generate electrical output signals representative of the interference patterns of the beams 50a, 50b and 52a, 52b. The output signals are sent to a stage controller 68 that calculates stage position as further described below.

The beam splitters 28, 42 can be polarized beam splitters. If the beam splitter 28 is a polarized beam splitter as described above and shown for the first embodiment, $\lambda/4$ plates 55 are inserted after beam splitter 28 and right angle reflector 36, and an analyzer 57 is added prior to the sensor 34, as is well known by those skilled in the art. The $\lambda/4$ plates 55 and analyzer 57 will not be needed if a normal beam splitter is used for beam splitter 28. If the beam splitter 42 is also a polarized beam splitter as described above and shown for the first embodiment, $\lambda/4$ plates 59 are inserted between the right angle reflector 44 and the beam splitter 28, as is well known by those skilled in the art. The $\lambda/4$ plate 59 will not be needed if a normal beam splitter is used for the beam splitter 42. The $\lambda/4$ plates 55, the analyzer 57 and the $\lambda/4$ plate 59 may be included as appropriate in the embodiments described below if polarized beam splitters are used. For simplification of the schematics, the $\lambda/4$ plates 55, the analyzer 57 and the $\lambda/4$ plate 59 are not shown in the following schematics.

Figure 3:
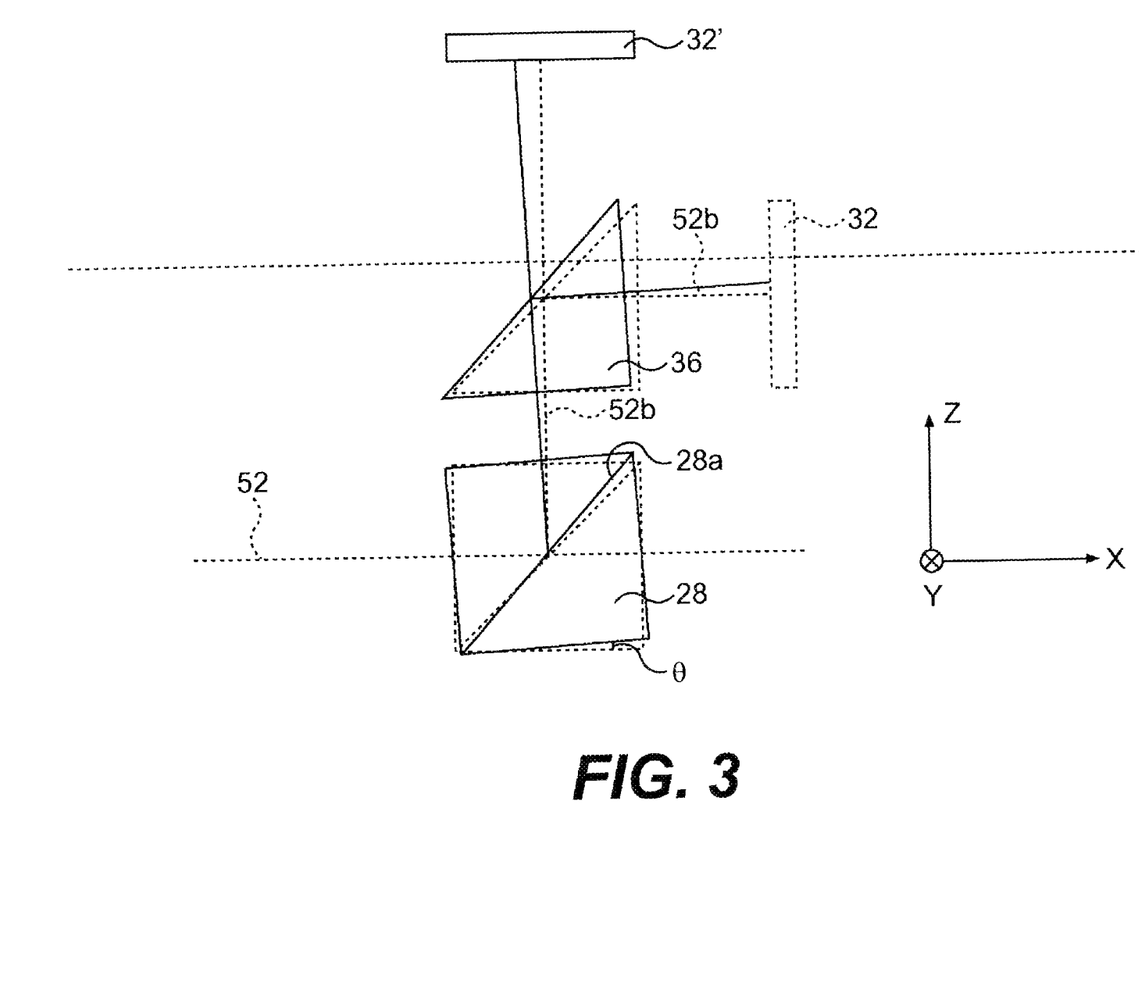
FIG. 3 is a schematic showing changes in optical path lengths of light beams due to movement of the optical components.
Figure 4:
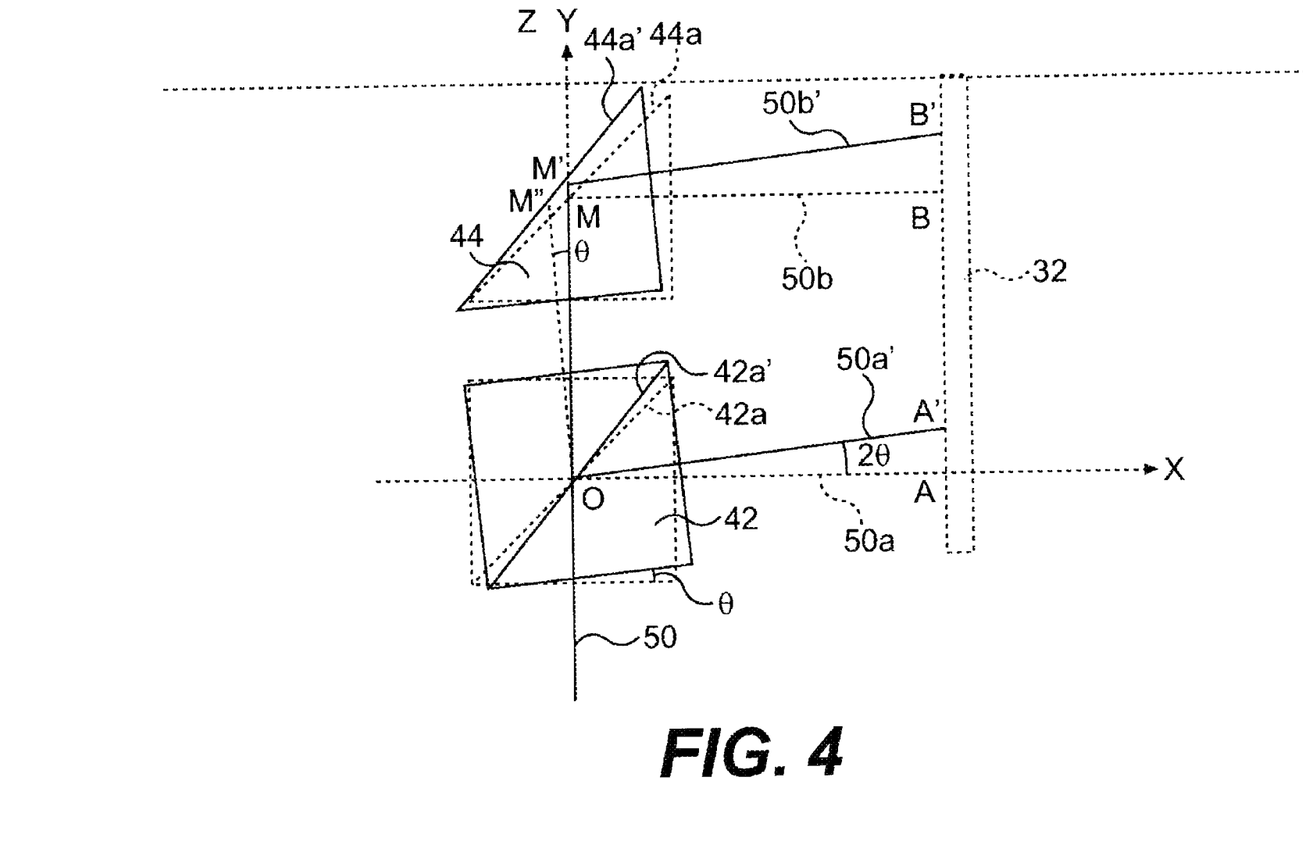
FIG. 4 is the schematic of FIG. 3 defining angles and optical path lengths of light beams due to movement of the optical components.

FIG. 3 shows a portion of the interferometer system 20 with the beam splitter 28 tilted relative to the x axis (i.e., rotated about the y axis). As shown in FIG. 4, the beam splitter 42 that is also mounted on the support block 60 is similarly tilted relative to the x axis. As the beams 50a and 50b leave the beam splitter 42 they propagate towards the reference mirror 32 at an angle relative to their position when the beam splitter 42 is not tilted (shown in phantom in FIG. 3). Referring to FIG. 3, the change in optical path length of the reference beam 52b of the measurement interferometer at a location between the beam splitter surface 28a and the reference mirror 32' when the beam splitter 28 is rotated is calculated as:

$$\Delta = L/\cos 2\theta - L \approx 2L\theta^2$$

where:

$\Delta$=correction factor for stage position due to tilt of optical components (change in optical path length of the beam 52b between the beam splitter surface 28a and the reference mirror 32; ($R_t - R_0$);

L=optical path length between the reference mirror 32 and the beam splitter surface 28a along the reference path; and $\theta$=tilt angle of support block (with respect to the x axis as viewed in FIG. 3).

For example, if L=500 mm and $\theta$=15 arc seconds, $\Delta$ is about 5 nm. If the support block 60 is not tilted relative to the x axis, $\Delta$=0 for the above equation and no correction of the stage position is required.

The correction interferometer is used to measure the tilt angle $\theta$ of the support block 60 relative to the x axis, which is then used to calculate the correction factor $\Delta$ to determine the stage position. The tilt angle $\theta$ is calculated from a change of optical path difference $\delta(\Delta r)$ between the two reference beams 50a, 50b of the correction interferometer as follows:

$$\Delta r(\theta = 0) = (OM + MB) - OA = OM = p$$

$$\Delta r(\theta) = (OM' + M'B') - OA'$$
$$= OM + MM'$$
$$= p + MM'$$

$$\delta(\Delta r) = \Delta r(\theta) - \Delta r(0) = MM'$$

M(0,p) Equation of M'' is ($-p \sin \theta$, $p \cos \theta$). Equation of 44a is;

$$y - p \cos \theta = \tan(\theta + \pi/4)(x + p \sin \theta)$$

M' is an intersection between y-axis and 44a'.

$$M'\left(0, \frac{p}{\cos\theta - \sin\theta}\right)$$

$$\delta(\Delta r) = MM' = \frac{p}{\cos\theta - \sin\theta} - p = p\left(\frac{1}{\cos\theta - \sin\theta} - 1\right)$$

$\delta(\Delta r)$ is measured by the correction interferometer. $\theta$ is calculated by this equation.

The error in the measurement of position of the stage S due to tilt of the support block 60 is corrected by providing $\Delta r$ to the controller 68. The controller 68 uses $\Delta r$ to calculate $\theta$ from the above equation. Once $\theta$ is known, the correction factor $\Delta$ can be calculated and used to correct the stage position provided by the measurement interferometer. The corrected stage position Sc is calculated as follows:

$$Sc = S_0 - 2L\theta^2$$

where:

Sc=corrected stage position;

$S_0$=measured stage position;

L=optical path length between the reference mirror 32 and the beam splitter surface 28a; and $\theta$=tilt angle of the support block 60 (with respect to the x axis as viewed in FIG. 3B).

Figure 13:
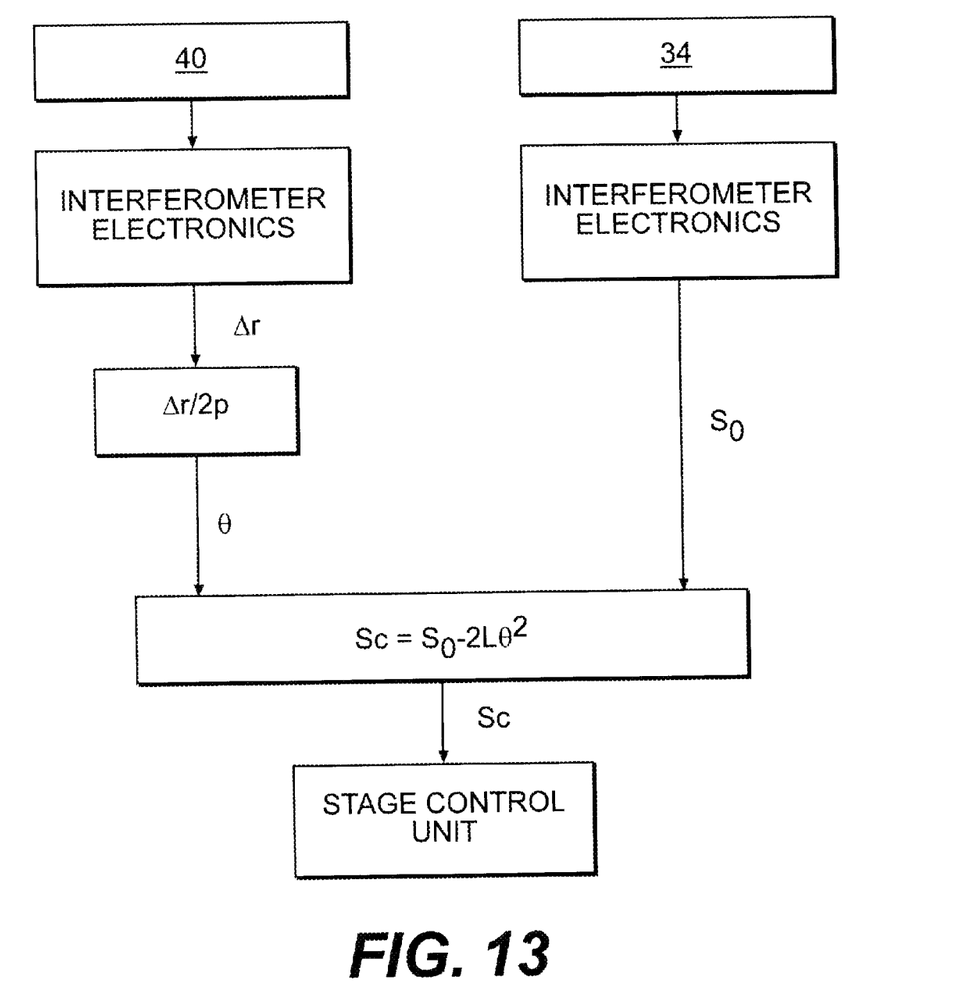
FIG. 13 is a schematic of a control system of the interferometer system of the invention.

A schematic of the control system is shown in FIG. 13. Information from the sensors 34, 40 is provided to the interferometer electronics where Δr and $S_0$ are calculated. The tilt angle θ is then calculated from Δr and the corrected stage position Sc is provided to the stage control unit.

Figure 5:
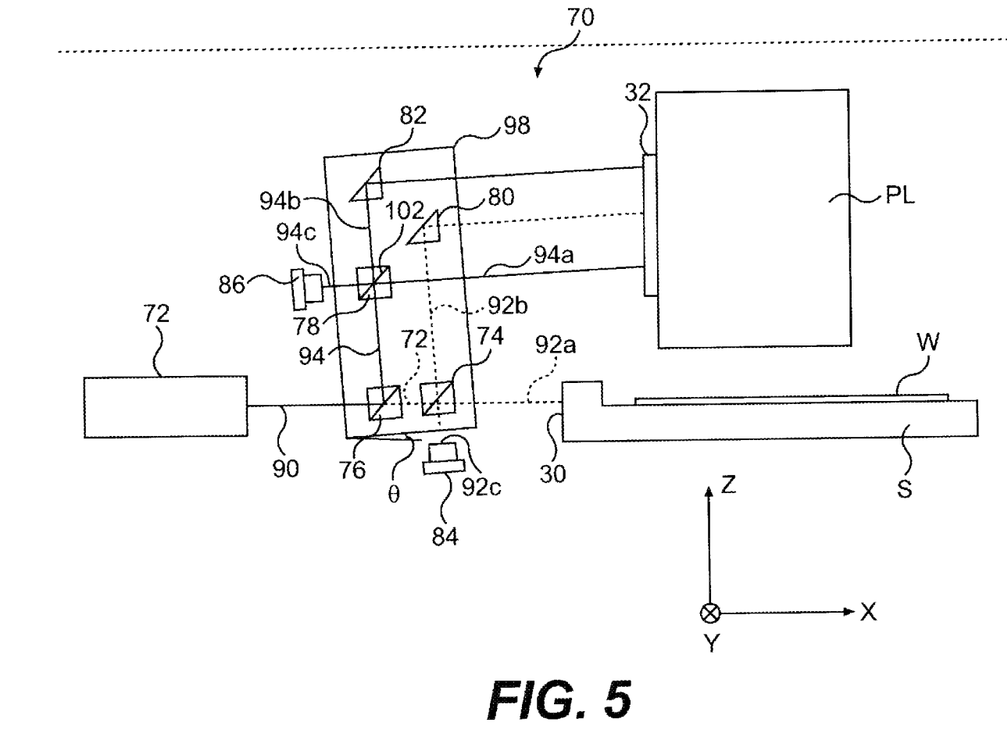
FIG. 5 is a side view of the interferometer system of FIG. 2 with the optical components in a tilted position.

One embodiment of the interferometer system is shown in FIGS. 2 and 5 and generally indicated at 70. The system 70 includes a laser source 72, the measurement mirror 30 attached to the stage S, the reference mirror 32 attached to the projection lens PL, three beam splitters 74, 76, 78 (one for a measurement interferometer and two for a correction interferometer, respectively), two right angle reflectors 80, 82, and two sensors 84, 86. The beam splitters 74, 76, 78 and right angle reflectors 80, 82 are mounted on a support block 98.

The propagation of light beams through the system 70 is as follows. A laser beam 90 emitted from the laser source 72 is first split into a measurement interferometer beam 92 and a correction interferometer beam 94 by the beam splitter 76. The measurement interferometer beam 92 is transmitted through the beam splitter 76 to the beam splitter 74 where it is split into measurement beam 92a and reference beam 92b (first pair of beams). The measurement beam 92a is transmitted through the beam splitter 74 and reflected by the measurement mirror 30 back to the beam splitter 74 where it is combined with the returning reference beam 92b and directed as beam 92c to the sensor 84. The reference beam 92b is reflected from the beam splitter 74 to the right angle reflector 80 where it is reflected to the reference mirror 32 and then reflected back along the same reference path until it reaches the beam splitter 74 and is combined with the measurement beam 92a. The correction interferometer beam 94 is reflected orthogonally from the beam splitter 76 to the beam splitter 78 where it is split into two support block measurement beams 94a and 94b (second pair of beams). The beam 94b is linearly polarized so that it passes through a polarizing surface 78a of the beam splitter 78 without being reflected therefrom. The beam 94b is then reflected by the right angle reflector 82 to the reference mirror 32 where it is reflected back along the same path. The beam 94a is reflected directly from the beam splitter 78 into the reference mirror 32 where it is reflected back along the same path and combines with the beam 94b at the beam splitter 78. The combined beams 94a and 94b propagate to the sensor 86 as beam 94c. The calculation of tilt of the support block 98 is performed as described above for the first embodiment.

Figure 6:
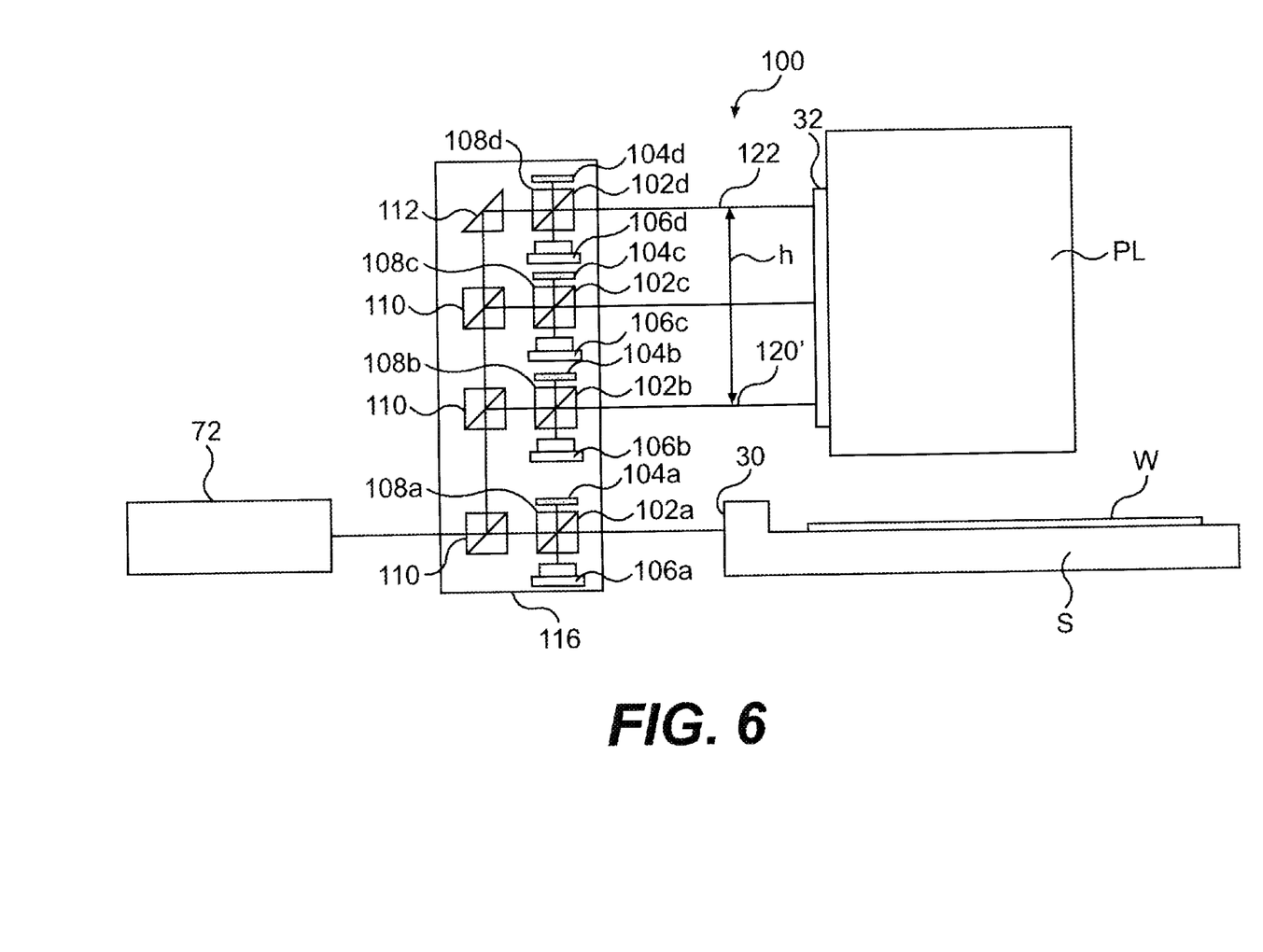
FIG. 6 is a side view of another embodiment of the interferometer system of FIG. 2.

FIG. 6 shows another embodiment of the interferometer system of the invention that is generally indicated at 100. The interferometer system 100 includes the single laser source 72 and four absolute interferometers 102a, 102b, 102c, 102d. Each absolute interferometer 102a–102d includes its own reference mirror 104a, 104b, 104c, 104d, sensor 106a, 106b, 106c, 106d, and beam splitter 108a, 108b, 108c, 108d, respectively. Additional beam splitters 110 and right angle reflector 112 are provided to direct beams to their respective interferometers 102a–102d. The absolute interferometers 102a–102d, additional beam splitters 110, and right angle reflector 112 are mounted on a support block 116. The sensors 106a and 106c provide measurement of the stage position relative to the projection lens PL without correction for movement of the support block. The stage position $S_0$ is calculated as the difference between the output sensors 106a and 106c. The sensors 106b and 106d provide the measurement for tilt of the support block so that the corrected stage position Sc can be calculated. The tilt of the support block 116 is calculated as the difference between the outputs of sensors 106b and 106d, divided by a distance h between reference beams 120 and 122.

Figure 7:
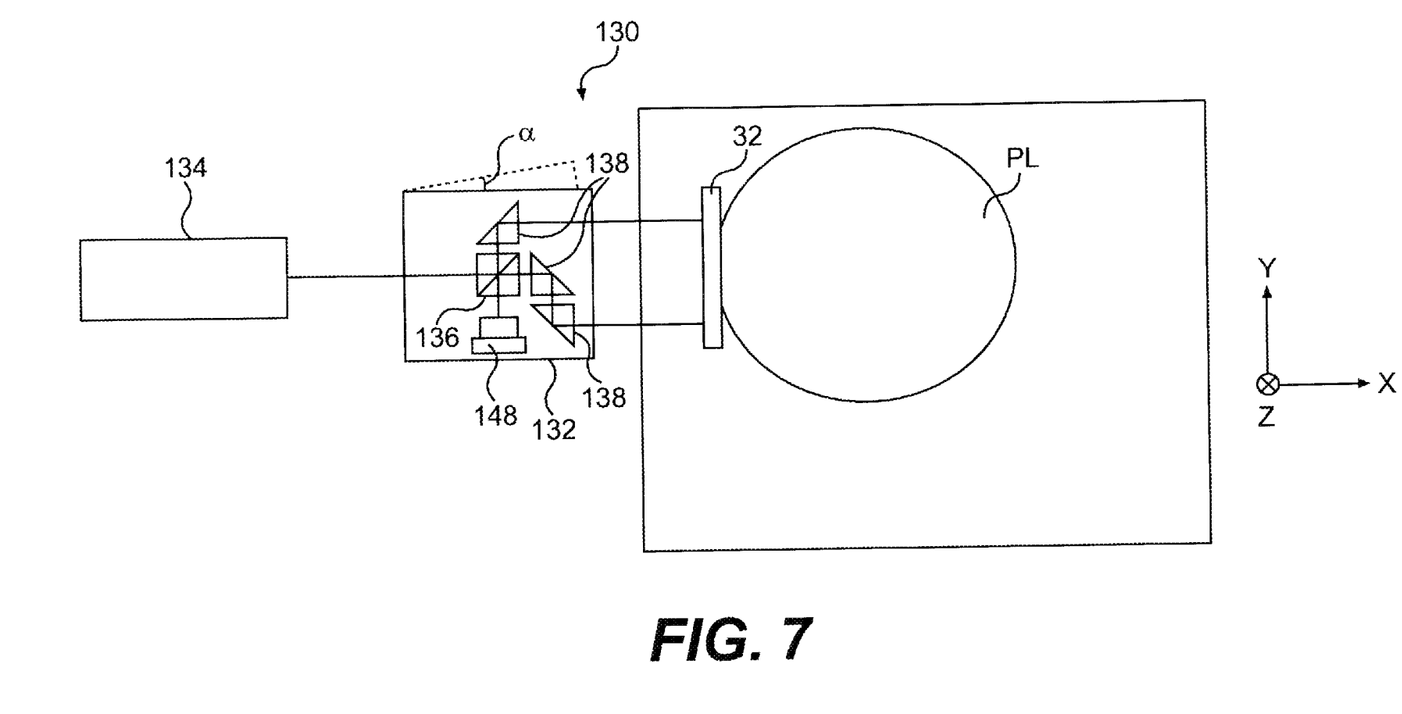
FIG. 7 is a top view of another embodiment of the interferometer system of FIG. 2.

Another embodiment of the interferometer system is shown in FIG. 7 and generally indicated at 130. The interferometer system 130 measures rotation of an optical support block 132 about the z axis (tilt at angle a relative to the x axis). The interferometer system 130 may be used in combination with the interferometer systems 20, 70, 100 described above to correct for movement of the block in the xy and xz planes. The interferometer system 130 includes a laser source 134, a beam splitter 136, three right angle reflectors 138, the reference mirror 32, and a sensor 148. Correction of the stage position (as measured by the measurement interferometer described above) to compensate for error due to rotation of the block is calculated from the following equation:

$$\Delta = 2L\alpha^2$$

where:

Δ=correction factor for stage position (see above);

L=optical path length between the reference mirror 32 and the beam splitter 136; and α=tilt of support block 132 relative to the x axis.

Figure 8:
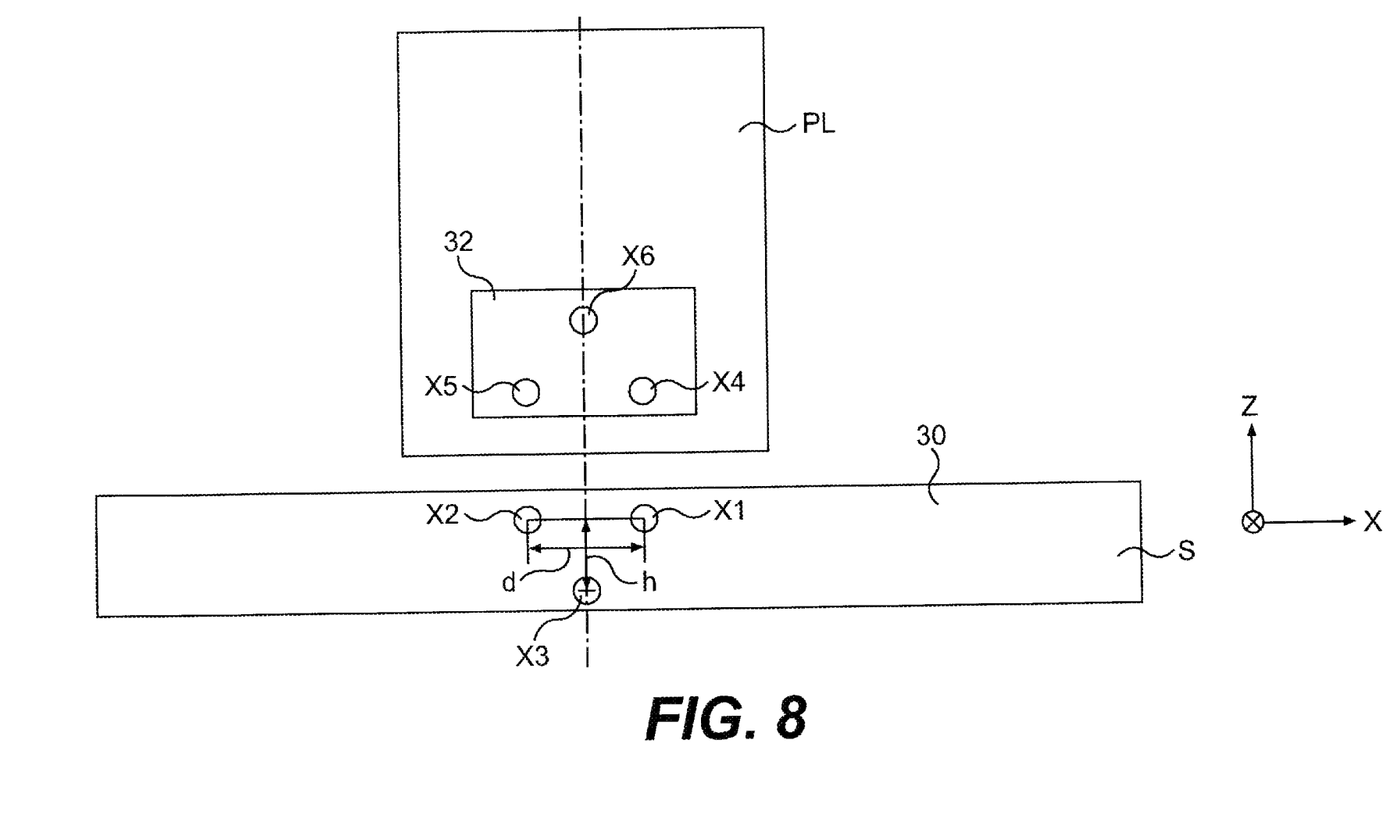
FIG. 8 is a schematic showing multiple beams on a reference mirror and measurement mirror for use in measuring position of the stage and optical components.

FIG. 8 shows an example of an arrangement of beams X1–X6 used to measure position of the stage and support block. A minimum number of beams are provided to measure rotation and tilt of the stage and rotation and tilt of the support block as follows:

stage height along $z$ axis=$((X1-X4)+(X2-X5))/2$ stage rotation about $z$ axis=$(X1-X2)/d$ stage rotation about $x$ axis=$((X1+X2)/2-X3)/h$ support block rotation about $z$ axis=$(X4-X5)/d$ support block rotation about $y$ axis=$((X4+X5)/2-X6)/h$ where:

X1–X3 are contact points of the respective beams on the measurement mirror 30 as shown in FIG. 8;

X4–X6 are contact points of the respective beams on the reference mirror 32 as shown in FIG. 8;

d=distance between points X1 and X2; and h=distance between X3 and a line extending through points X1 and X2.

It is to be understood that a different number of beams or a different arrangement of beams may be used without departing from the scope of the invention. The beams X1–X6 may be provided by the interferometer systems 20, 70, 100, 130, or any combination thereof.

Figure 9:
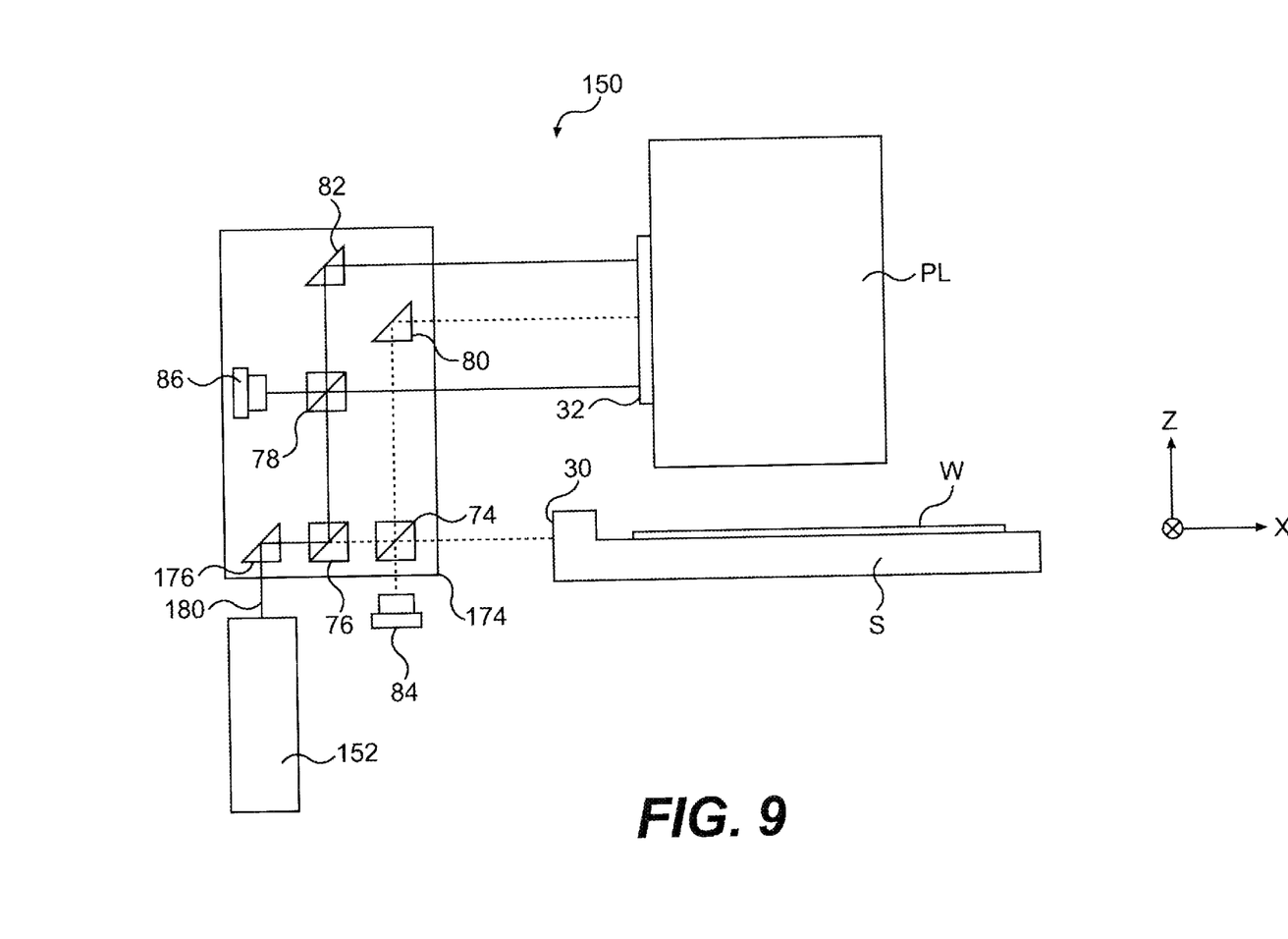
FIG. 9 is a side view of another embodiment of the interferometer system of FIG. 2.
Figure 10:
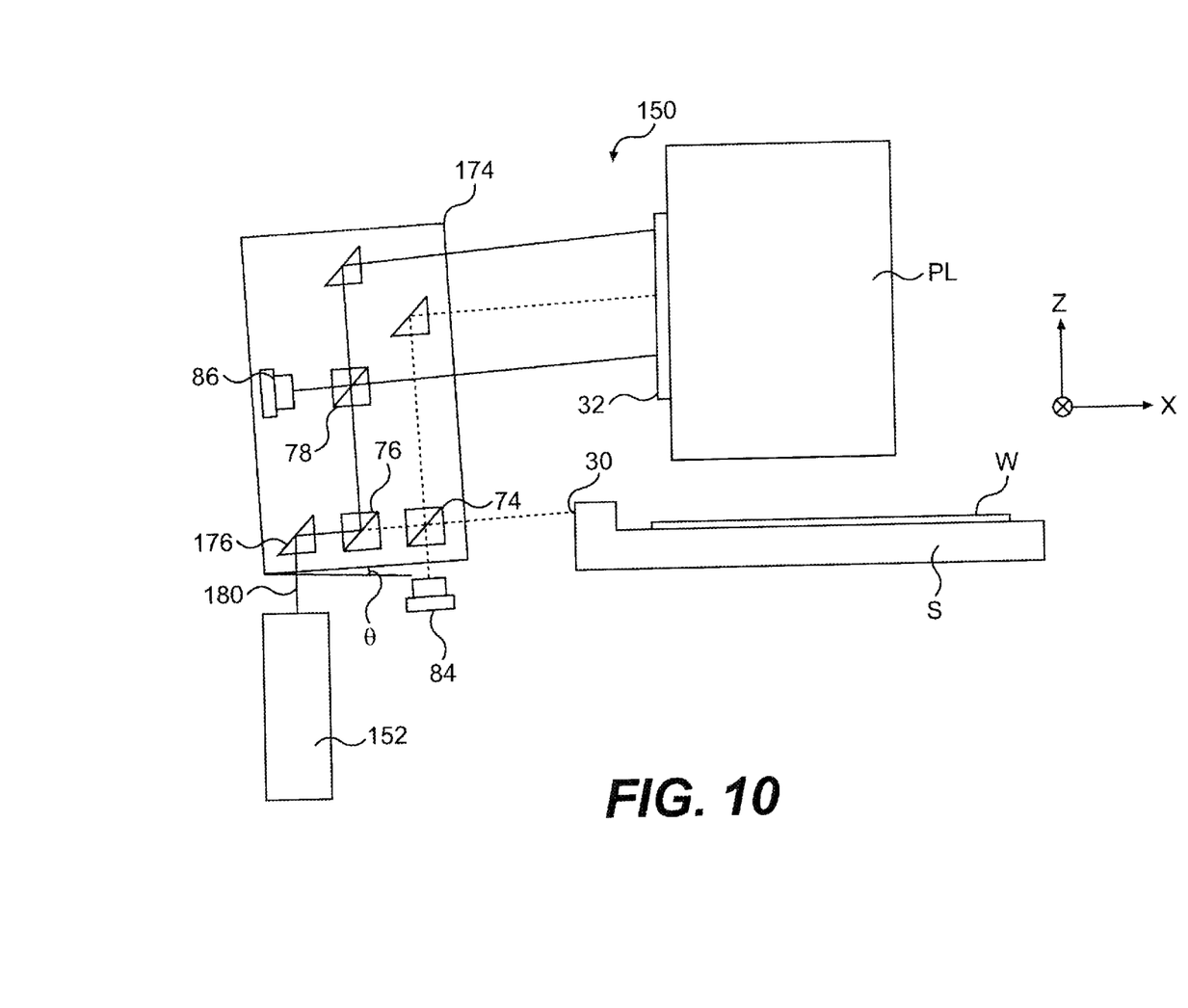
FIG. 10 is a side view of the interferometer system of FIG. 9 with the beam splitter in a rotated position.
Figure 11:
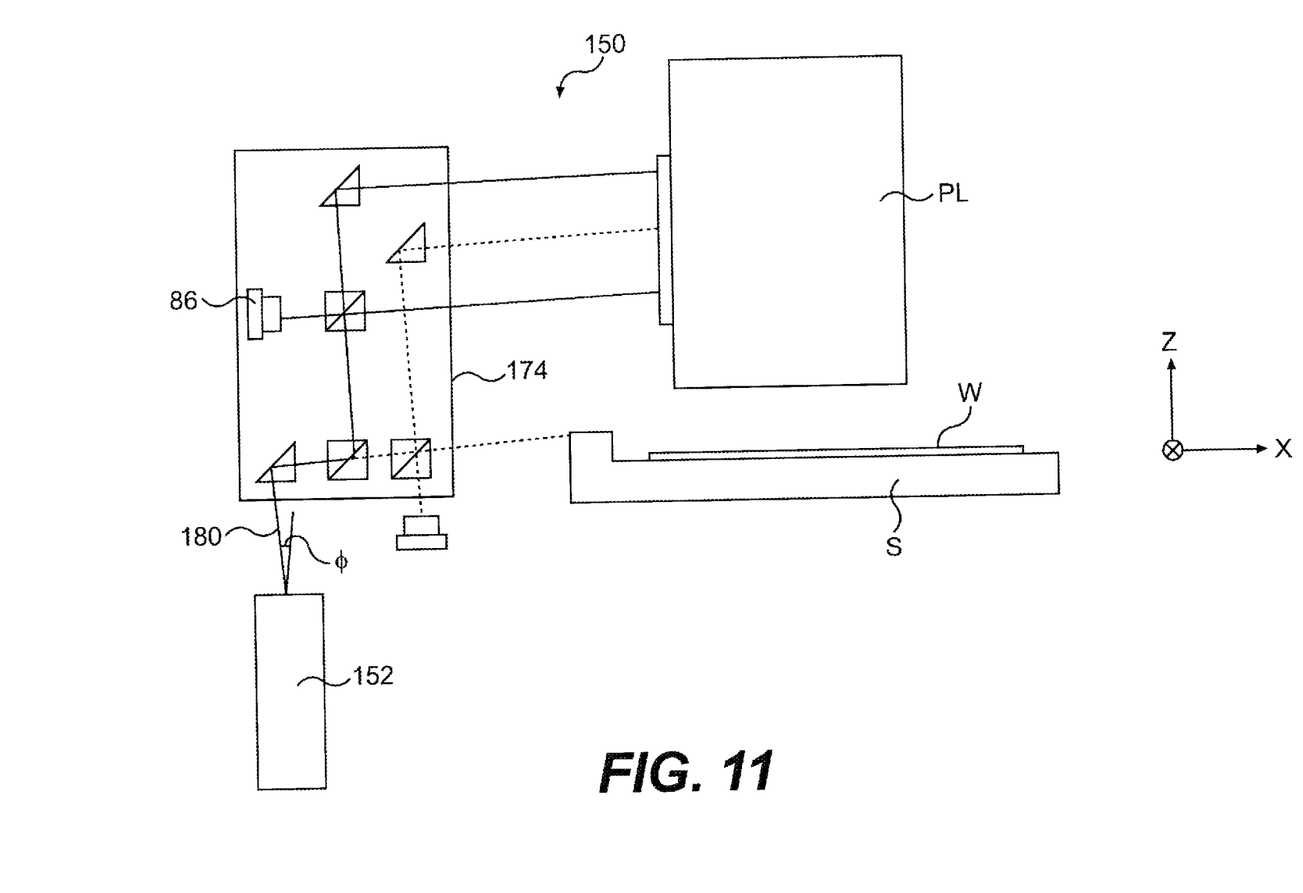
FIG. 11 is the interferometer system of FIG. 9 with a light beam exiting from a beam source at an angle.

Another embodiment of the interferometer system is shown in FIGS. 9–11 and generally indicated at 150. The system is similar to embodiment 70 shown in FIG. 5 except that a laser source 152 is positioned below a support block 174 and an additional right angle reflector 176 is provided to direct a beam 180 into the beam splitter 76. FIG. 10 shows the support block 174 tilted at an angle θ relative to the x axis. The error due to tilt of the support block 174 is calculated as:

$$\Delta = 2(L-S_0)\theta^2$$

where:

Δ=correction factor for stage position due to tilt of optical components as described above;

$S_0$=measured stage position;

L=optical path length between the reference mirror 32 and the beam splitter 74; and θ=tilt angle of support block 174 (with respect to the x axis as shown in FIG. 10).

The corrected position of the stage Sc is then calculated as:

$$Sc = (S_0 - 2L\theta^2)/(1 - 2\theta^2)$$

where:

Sc=corrected stage position; and $S_0$=measured stage position.

The reason that the correction factor equation is different for this embodiment 150, as compared to the first and second embodiments 20, 70, is that the support block tilt affects only reference beam 92b for the first and second embodiments (FIG. 4). In the case of embodiment 150, support block tilt affects both the reference mirror 32 and measurement mirror 30 beams (FIG. 9).

The interferometer system 150 may also be used to compensate for error in measured stage position $S_0$ due to bending or instability of the laser beam 180 as it exits the laser source 152 (FIG. 11). Tilt of the laser beam 180 at an angle Φ (exit angle) relative to the z axis (or central longitudinal axis of the laser source 152) results in an error of $2(L-S)\Phi^2$. Stage position with correction for both tilt of the support block 152 and laser beam 180 is calculated as:

$$Sc = (S_0 - 2L(\theta+\Phi)^2)/(1 - 2(\theta+\Phi)^2)$$

Figure 12:
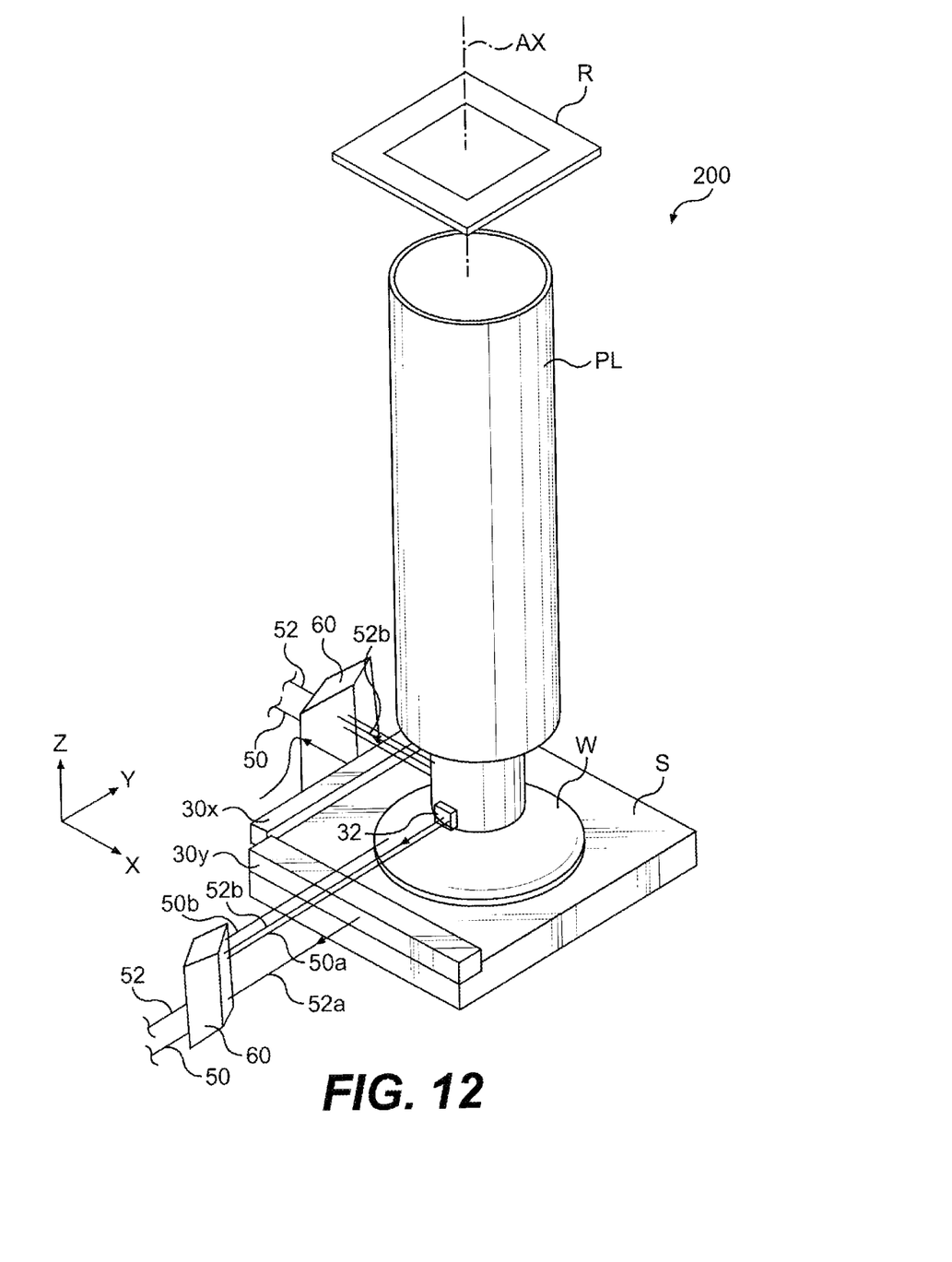
FIG. 12 is a perspective of a portion of the interferometer system of the invention applied to a wafer stage of a projection type exposure apparatus.

FIG. 12 schematically illustrates an example of an exposure apparatus, generally indicated at 200, using the interferometer system 20 of the invention. The exposure apparatus 200 generally includes an optical system, the wafer stage S for supporting and positioning the wafer W, a reticle stage (not shown) for supporting and positioning a reticle R, and motors (not shown) for positioning the wafer stage and reticle stage. The optical system projects light through a mask pattern (e.g., circuit pattern for a semiconductor device) formed in the reticle R that is supported and scanned using the reticle stage. The optical system includes a projection lens PL, an illuminator (not shown) having an optical integrator for producing secondary light source images and a condenser lens for illuminating the reticle R with uniform light flux. The projection lens PL focuses the light onto the wafer W. The wafer W is positioned under the projection lens PL and preferably held by vacuum suction on a wafer holder (not shown) that is supported by the wafer stage S. In operation, light beams from the illuminator pass through the reticle R and expose photoresist on the wafer W, which is supported and scanned using the wafer stage S driven by the motor.

The stage S is movable in at least two directions along the x and y axes in a plane perpendicular to an optical axis AX of the exposure apparatus 200. Measurement mirrors 30x, 30y are provided at two locations around the stage S. The measurement mirror 30y has its reflecting surface extending along the x axis for measuring movement of the stage S in the y direction and the measurement mirror 30x has its reflecting surface extending along the y axis for measuring movement of the stage in the x direction. The reference mirrors 32 (only one shown) are mounted on a lower portion of the projection lens PL and provide the reference measurement for the coordinate position of the stage S.

Further details of the components of the exposure apparatus 200 may be referenced from U.S. Pat. No. 5,528,118, by M. Lee, for example. It is to be understood that the invention is not limited to the exposure apparatus 200 described herein or to exposure systems for wafer processing. The general reference to the exposure apparatus 200 is purely for illustrating an embodiment of an environment in which the invention may be used.

It will be observed from the above description that the interferometer systems 20, 70, 100, 130, 150 of the invention provide a number of advantages over prior art systems. Importantly, the interferometer systems 20, 70, 100, 130, 150 account for displacement of the optical components of the interferometer system due to environmental effects such as thermal fluctuations, or vibrations, thus providing more accurate stage position measurement than possible with prior art interferometer systems.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An interferometric measuring system comprising:

a movable member having a measurement reflector attached thereto;

a stationary member having a reference reflector attached thereto;

a light source for providing a light beam; and an optical support block having first and second beam splitters mounted thereon;

the first beam splitter being operable to convert said light beam into a first pair of beams, and arranged to direct one of said first pair of beams along a reference path to the reference reflector and the other of said first pair of beams along a measurement path to the measurement reflector to create a measurement interference pattern between said first pair of beams for measuring a position of the movable member;

the second beam splitter being operable to form a second pair of beams and arranged to direct said second pair of beams along support block measurement paths to the reference reflector, the second beam splitter being configured to form a correction interference pattern between said second pair of beams for determining error in the measured position of the movable member due to movement of the optical support block.

2. The interferometric measuring system of claim 1, further comprising a first quarter-wave plate positioned in the reference path, a second quarter-wave plate positioned in the measurement path, and an analyzer through which the reference path and the measurement path pass; wherein said first splitter is polarized beam splitters, the first pair of beams is a first pair of polarized beams.

3. The interferometric measuring system of claim 1 wherein the first beam splitter is optically aligned with the measurement reflector along a central axis and interposed between the light source and the measurement reflector.

4. The interferometric measuring system of claim 1 further comprising a right angle reflector positioned in the reference path between the first beam splitter and the reference reflector to redirect one of said first pair of beams toward the reference reflector.

5. The interferometric measuring system of claim 1 wherein the light source comprises a laser.

6. The interferometric measuring system of claim 1 further comprising a first sensor for receiving the measurement interference pattern and a second sensor for receiving the correction interference pattern.

7. The interferometric measuring system of claim 1 further comprising a controller for calculating a corrected position of the movable member from the measurement interference pattern and the correction interference pattern.

8. The interferometric measuring system of claim 1 further comprising a second light source for providing a second light beam, the second beam splitter being operable to convert the second light beam into the second pair of beams.

9. The interferometric measuring system of claim 1 further comprising two right angle reflectors, one of the right angle reflectors being positioned for directing one of said second pair of beams to the reference reflector and the other of the right angle reflectors being positioned for directing one of said first pair of beams to the reference reflector.

10. The interferometric measuring system of claim 1 further comprising a third beam splitter interposed downstream of the light source for splitting the light beam towards the first beam splitter and the second beam splitter.

11. The interferometric measuring system of claim 10 further comprising a first right angle reflector positioned within the reference path and a second right angle reflector positioned within one of the block measurement paths.

12. The interferometric measuring system of claim 10 wherein the light source is optically aligned with the third beam splitter.

13. The interferometric measuring system of claim 10 further comprising three absolute interferometers positioned within the reference path and the support block measurement paths, each of said absolute interferometers comprising a reference mirror and a sensor.

14. The interferometric measuring system of claim 1 wherein the movable member is a wafer stage and the stationary member is a projection lens.

15. A method of measuring a position of a movable member relative to a stationary member with an interferometric measuring system and correcting for movement of optical components within the system relative to the stationary member, the movable member having a measurement reflector attached thereto and the stationary member having a reference reflector attached thereto, the method comprising:

sensing a measurement interference pattern between a measurement light beam propagated through a measurement optical path including the measurement reflector, and a reference light beam propagated through a reference optical path including the reference reflector to measure a position of the movable member relative to the stationary member;

sensing a correction interference pattern between two correction light beams propagated through optical component measurement paths including the reference reflector to measure a position of the optical components relative to the stationary member; and correcting the measured position of the movable member based on the measured position of the optical components.

16. The method of claim 15 wherein correcting the position of the movable member comprises calculating an angle of rotation of the optical components based on the correction interference pattern.

17. The method of claim 15 wherein sensing a correction interference pattern comprises measuring rotation of the optical components relative to a central axis extending generally parallel to said correction light beams as they are emitted from a light source.

18. The method of claim 17 wherein sensing a correction interference pattern further comprises measuring rotation of the optical components relative to an axis extending generally perpendicular to the central axis.

19. The method of claim 15 wherein sensing a correction interference pattern comprises measuring an exit angle of a light beam from a light source.

20. An exposure apparatus, comprising:

a movable stage having a measurement reflector attached thereto;

a stationary lens having a reference reflector attached thereto;

a light source for providing a light beam; and an optical support block having first and second beam splitters mounted thereon;

the first beam splitter being operable to convert said light beam into a first pair of beams, and arranged to direct one of said first pair of beams along a reference path to the reference reflector and the other of said first pair of beams along a measurement path to the measurement reflector to create a measurement interference pattern between said first pair of beams for measuring a position of the movable stage;

the second beam splitter being operable to form a second pair of beams and arranged to direct said second pair of beams along support block measurement paths to the reference reflector, the second beam splitter being configured to form a correction interference pattern between said second pair of beams for determining error in the measured position of the movable stage due to movement of the optical support block.

21. In a method of manufacturing semiconductor devices, a method of measuring a position of a movable stage relative to a stationary lens with an interferometric measuring system and correcting for movement of optical components within the system relative to the stationary lens, the movable stage having a measurement reflector attached thereto and the stationary lens having a reference reflector attached thereto, the measuring method comprising:

sensing a measurement interference pattern between a measurement light beam propagated through a measurement optical path including the measurement reflector, and a reference light beam propagated through a reference optical path including the reference reflector to measure a position of the movable stage relative to the stationary lens;

sensing a correction interference pattern between two correction light beams propagated through optical component measurement paths including the reference reflector to measure a position of the optical components relative to the stationary lens; and correcting the measured position of the movable stage based on the measured position of the optical components.

* * * * *